United States Patent [19]

Collins

[11] 4,290,747
[45] Sep. 22, 1981

[54] PHOTOFLASH LAMP ARRAY CIRCUIT BOARD HAVING RADIATION SENSITIVE FUSE ELEMENTS

[75] Inventor: Edward J. Collins, Mentor-on-the-Lake, Ohio

[73] Assignee: General Electric Company, Schenectady, N.Y.

[21] Appl. No.: 92,696

[22] Filed: Nov. 9, 1979

[51] Int. Cl.³ .............................................. F21K 5/00
[52] U.S. Cl. ...................................... 431/359; 362/13
[58] Field of Search ................. 431/359; 362/4, 6, 11, 362/13, 16

[56] References Cited

U.S. PATENT DOCUMENTS

| | | | |
|---|---|---|---|
| 3,443,875 | 5/1969 | Herrmann | 431/359 |
| 3,532,931 | 10/1970 | Cote´ et al. | 431/359 |
| 3,968,056 | 7/1976 | Bolon et al. | 252/514 |
| 3,988,647 | 10/1976 | Bolon et al. | 317/10 LB |
| 4,017,728 | 4/1977 | Audesse et al. | 431/359 X |
| 4,087,233 | 5/1978 | Shaffer | 362/6 X |
| 4,097,220 | 6/1978 | Cote´ et al. | 431/359 |
| 4,128,858 | 12/1978 | Sterling et al. | 362/13 |
| 4,133,631 | 1/1979 | Collins et al. | 431/359 |
| 4,154,569 | 5/1979 | Van Werkhoven | 91/357 |
| 4,182,607 | 1/1980 | Collins et al. | 431/359 |

Primary Examiner—Samuel Scott
Assistant Examiner—Randall L. Green
Attorney, Agent, or Firm—John F. McDevitt; Lawrence R. Kempton; Philip L. Schlamp

[57] ABSTRACT

Improved fuse arrangement used with the circuit board to provide more reliable sequential firing in a flash lamp array. The circuit board includes a lamp firing circuitry along with radiation switches connected in said circuitry and a more reliable series connected fuse arrangement to cooperate with said radiation switches in the circuit operation. The individual fuse elements are constructed as an integral part of the lamp firing circuit pattern deposited on the circuit board at circuit locations wherein the underlying circuit board substrate has a thickness less than the substrate thicknesss elsewhere and desirably cooperate in raising the dielectric breakdown voltage characteristic of the fuse combination.

13 Claims, 2 Drawing Figures

PHOTOFLASH LAMP ARRAY CIRCUIT BOARD HAVING RADIATION SENSITIVE FUSE ELEMENTS

RELATED PATENT APPLICATION

In U.S. patent application Ser. No. 092,697, concurrently filed with the present application in the names of the present inventor and W. A. Lenkner, there is disclosed a photoflash lamp array circuit board having improved radiation sensitive fuse means. Said improved fuse means is provided with a circuit pattern utilizing an organic resin matrix having particulated electrically conductive material and a radiation absorbing material dispersed therein by narrowing the width of said circuit pattern at the fuse locations while further reducing the thickness of the underlying dielectric substrate of the circuit board member relative to the remaining thickness of said dielectric substrate. The present invention represents a still further improvement wherein alternate fuse means are provided that desirably raises the dielectric breakdown voltage of the overall fusing arrangement by a significant degree.

BACKGROUND OF THE INVENTION

Radiation sensitive fuse elements for use with a circuit board to provide more reliable sequential firing in the flash lamp array are already known. For example, U.S. Pat. No. 4,133,631, assigned to the assignee of the present invention, describes a circuit board configuration which includes such fuse elements being deposited at circuit locations wherein the underlying substrate has a thickness less than a substrate thickness elsewhere to produce holes in the circuit board by melting or thermal decomposition when activated by radiation being emitted from adjacent flash lamps. Said fuse elements are deposited on the underlying circuit board substrate and comprise at least 20% or more of a radiation absorbent solid particulate such as carbon black mixed with conventional liquid adhesive which hardens to a solid at ordinary temperatures. When this fuse material composition is deposited directly on the circuit pattern and allowed to harden at locations on the circuit board that have been recessed to enhance localized melting of decomposition of the underlying substrate, the fuse actuation produces a hole through the entire composite structure. Interruption of the circuit path is obtained in this manner to the activating flash lamp which can be disposed in a branch circuit along with a fuse element and thereby disrupt electrical connection to the already fired flash lamp.

Another type known radiation sensitive fuse element construction for use in the same general manner is described in U.S. Pat. No. 4,154,569. This type fuse element construction utilizes a strip-like element which overlies a reduced thickness area of the circuit board member and which can be constructed from a polymer film deposited on the circuit board substrate which is thereafter perforated to help isolate the absorbed thermal energy in said strip element for more reliable thermal decomposition of the entire fuse. The circuit board pattern on which said strip elements are deposited is said to be formed of metal, for example silver, nickel, tin, copper or some other readily conducting material, for example graphite. The circuit board support for the electrical circuit is also said to be pigmented in order to improve heat absorbing capacity of the overall construction and soluble dyes can also be incorporated with the thermoplastic synthetic resin composition of said dielectric support for this purpose. Additionally, a dye is recommended for incorporation in the polymer material forming a strip-like fuse element to further improve radiation absorption in the overall construction.

Still other issued U.S. Pat. No. 3,968,056 and U.S. Pat. No. 3,988,647, which are also assigned to the present assignee, describe a circuit board construction which can be used with a photoflash array wherein a particular type electrically conductive ink provides the circuit pattern. Specifically, said conductive ink comprises an organic resin matrix having sufficient particulated electrically conductive material dispersed therein to form point-by-point electrical contact when the deposited liquid ink is cured to the solid state. In a preferred embodiment, a liquid ink composition is radiation curable to provide a solid coating having electrical resistivity of less than 10 ohm-centimeters when cured. The particulated electrically conductive material providing electrical conductivity in said circuit pattern can be selected from a particulated electrically conductive metal and/or a particulated electrically conductive metal containing material which can further contain up to approximately 15% by weight of said particulated electrically conductive material in flake form with an aspect ratio of diameter to thickness greater than 20. The content of particulated electrically conductive material in said preferred embodiment is at least about 40% and not more than about 90% by weight with said particulated electrically conductive material preferably being in the form of metal coated glass spheres.

SUMMARY OF THE INVENTION

Lower intensity flash lamps are now being used for cost and energy saving considerations which creates a need for fuse elements in the above type photoflash arrays that interrupt the circuit path reliably with a lesser amount of radiation being available from such flash lamps. Accordingly, it is a primary object of the present invention to provide an improved fuse element construction in a circuit board of this type having both radiation sensitive switching elements and radiation sensitive fuse elements as part of the circuit pattern for cooperation therebetween when the associated lamps are flashed. Another object of the present invention is to provide fuse means which more reliably interrupts the circuit path when exposed to radiation from a cooperating flash lamp to thermally melt or decompose the underlying substrate and create a hole or opening for permanent disruption of the electrical connection. In accordance with said objects, it has now been discovered that a series circuit connection of the presently improved fuse elements increases the dielectric breakdown voltage of said combination with successive actuation of the individual fuse elements. Such operative association of the individual fuse elements serves to alleviate undesirable application of the high voltage firing pulse to an already flashed lamp. Such faulty operation can lead to a short circuit condition in the firing circuitry and cause still other problems, hence it is desirable to electrically isolate the already flashed lamps by increasing the voltage standoff capabilities for said lamps. Specifically, the present improvement is accomplished with a circuit board for a photoflash array having the lamp firing circuit pattern deposited on a dielectric substrate and radiation sensitive switches connected in said circuitry for sequential firing of a plurality of flash lamps connected thereto, said circuit pattern comprising an organic resin matrix having particulated electrically conductive material dispersed therein and further including radiation sensitive fuse elements located where said dielectric substrate has a reduced thickness relative to the remaining thickness of said dielectric substrate and with said fuse elements being formed by providing a more narrow width of said circuit pattern at the fuse locations than the remaining width of said circuit pattern, wherein said fuse elements are electrically connected together in a series circuit combination to increase the dielectric breakdown voltage of said combination upon successive actuation of the fuse elements. In a preferred embodiment, the circuit pattern material includes a radiation absorbent material which can be an organic dye dissolved in the thermoplastic polymer material. As previously indicated, the particulated electrically conductive material incorporated in said circuit pattern comprises metal coated glass spheres and the particulated electrically conductive material can further contain up to 15% by weight of said particulated electrically conductive material being metal plates. In a different preferred embodiment, a radiation absorbing coating is deposited on the circuit pattern at the fuse locations to eliminate need for any incorporation of a radiation absorbing material in the circuit pattern itself.

The particular circuit pattern material employed in the present invention, which is fully described in the aforementioned U.S. Pat. Nos. 3,968,056 and 3,988,647 hence need only be illustrated herein, serves an important role in accomplishing more reliable interruption of circuit pattern when the present fuse elements forming part of said circuit pattern are actuated. Electrical conductivity in said circuit pattern is solely attributable to physical contact between the electrically conductive filler particles so that physical separation therebetween effectively interrupts the circuit path. It is thereby not required that the fuse element portions of said circuit pattern be completely decomposed to form an opening entirely across the width of the circuit pattern since a lesser physical separation such as multiple cracks in the circuit pattern at the fuse locations raises the dielectric breakdown voltage of the opened fuse elements sufficiently to block a subsequently applied firing pulse. Such fuse operation represents an improvement compared to that taking place in the aforementioned U.S. Pat. No. 4,154,569 wherein the circuit pattern can be entirely metal thereby requiring thermal decomposition of the entire circuit pattern along with the underlying dielectric substrate at the fuse locations. In further explanation, the present fuse elements operate effectively to interrupt the circuit path when the underlying substrate supporting the circuit pattern is not totally destroyed so long as sufficient thermal decomposition of the circuit pattern takes place at the fuse locations to block a subsequently applied firing pulse.

The likelihood of developing a short circuit attributable to an already flashed lamp in the present circuit configuration is less than for the prior art circuit configuration disclosed in aforementioned U.S. Pat. No. 4,133,631. In said prior art circuitry, a branch circuit is employed for each lamp having a fuse element disposed therein and so connected that the likelihood of short circuiting can increase equally with each already flashed lamp in the sequence. As distinct therefrom, a high voltage firing pulse is applied to the series connected fuse arrangement in the present lamp firing circuit configuration which increases electrical isolation of the already flashed lamps in the sequence. Such increased electrical isolation of already flashed lamps results since the applied firing pulse must overcome the dielectric breakdown voltages of earlier opened fuse elements to produce a short circuit condition in an already flashed lamp. For example, the initially actuated flash lamp in the sequence will be increasingly less prone to short circuiting with successive lamp actuation since the dielectric breakdown voltages of all opened fuse elements must first be overcome in order to apply a firing pulse to said lamp. The consequence of said improvement is understandably greater operational reliability that all lamps in the sequence will be flashed.

DESCRIPTION OF THE PREFERRED EMBODIMENTS

Figure 1:
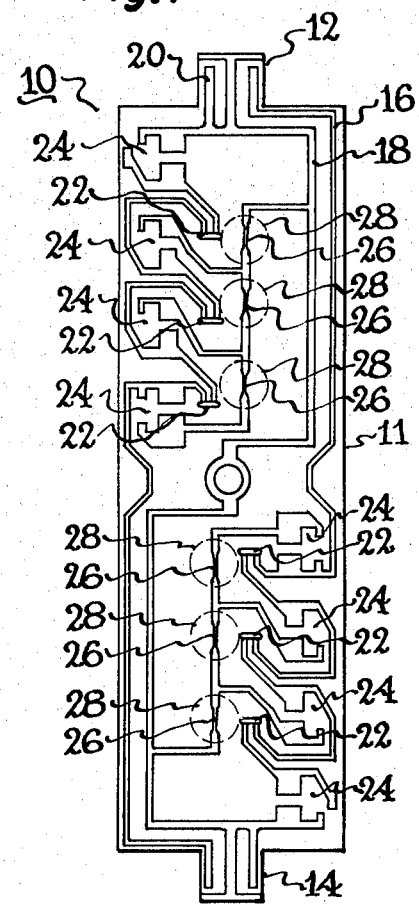
FIG. 1 is an illustration of a multiple flash lamp circuit board having the lamp firing circuit pattern in accordance with the present invention.

In the preferred circuit board embodiment depicted in FIG. 1, both radiation-sensitive switches and radiation-sensitive fuse elements are deposited on the circuit pattern adjacent flash lamp locations for simultaneous actuation of each adjoining switch and fuse element by radiation being emitted from an adjacent flash lamp. Accordingly, a lamp firing circuit pattern 10 is shown having been deposited on a circuit board member 11 preferably in the form of a thermoplastic organic polymer material, said circuit board member having connector tabs 12 and 14 located at each end for insertion of said circuit board member into an associated camera socket (not shown). The camera socket has contacts for conductor lines 16, 18, and 20 of the lamp firing circuit pattern to connect four flash lamps in parallel between conductive lines 16 and 18 when connector tab 12 has been inserted in the camera socket. Correspondingly, a second group of four lamps is connected between conductor lines 18 and 20 when connector tab 14 has been inserted in the camera socket. While an entire illustrated circuit board is shown, there is need to discuss only a single group of four flash lamps since the operation of the second group of four flash lamps is essentially the mirror image of the first group. Conductor line 16 includes a serially connected arrangement of radiation switches 22 to prevent the flash lamps in the group from all being fired together on release of the camera shutter. As can be noted, the switches 22 are each arranged in the region of the flash lamp termination 24 so that the heat and light released when the flash lamp is fired operates to convert the respective switch from a non-conductive to an electrically conductive state, thus establishing a current path to the next lamp to be flashed. Accordingly, when the particular flash lamp in the circuit is to be flashed, then the adjacent radiation switch is actuated providing a current path to the next lamp to be flashed. Each of the radiation switches is serially connected between the branch circuits connecting the lamps and the parallel circuit relationship as better shown by the schematic diagram in FIG. 2. Each of said radiation switches employ a material exhibiting an open circuit or high resistance condition and with said resistance thereafter becoming zero or a low value when said material absorbs radiation and/or heat from the adjoining flash lamp. Individual fuse elements 26 are thereby serially connected together in conductive line 18 as well as being located proximate to the flash lamp terminations 24 so as also to be actuated by the heat and light released when the adjacent flash lamp is flashed. Circular shaped indentations 28 (shown in phantom) surrounding each of said fuse elements 26 have been formed on the opposite side of the circuit board member to provide a lesser thickness than exists elsewhere on the circuit board and thereby assist interruption of the circuit path from conductor 18 to the already fired flash lamp. As can be noted, each of said fuse elements simply comprises a more narrow width of a circuit pattern at the fuse locations than the remaining width of said circuit pattern elsewhere. When the particular flash lamp adjacent to a given fuse element is flashed, the radiation and/or heat created thereby is absorbed by the circuit pattern at the fuse location whereupon the more narrow fuse element portions of said circuit pattern become sufficiently decomposed to disrupt the electrical connection to the already fired flashed lamp. As previously indicated, such interruption of a circuit path is accomplished by physical separation of the electrically conductive filler particles in the circuit pattern which can simply produce a series of cracks in the circuit pattern itself at the fuse locations. An increased dielectric breakdown voltage thereby occurs at the open fuse locations sufficient to block a subsequently firing pulse. There can also be additional thermal decomposition whereby the underlying reduced thickness portion of the circuit board member either thermally melts or decomposes to create an actual hole or opening at each fuse location.

Figure 2:
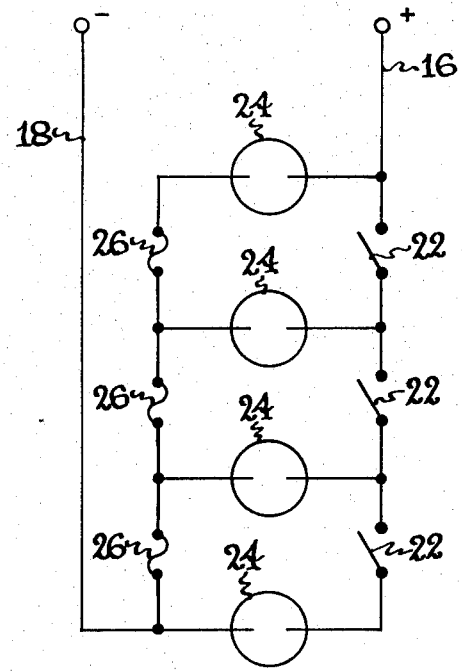
FIG. 2 is an electrical schematic diagram illustrating the circuit path for one group of four flash lamps being sequentially fired by the circuit board configuration in FIG. 1.

A more detailed description of the sequential firing operation for the circuitry of a four-lamp group in the above described circuit board is provided in connection with the schematic drawing shown in FIG. 2. Accordingly, in FIG. 2 there is shown a plurality of flash lamps 24 electrically connected in branch circuits to assure that the branch circuit of each lamp will become an open circuit upon flashing of the lamp in that circuit. The desired mode of operation is carried out starting with the topmost branch circuit when the lamp in said circuit is flashed and causes fuse element 26 in the same branch circuit to physically interrupt the circuit path to said lamp while simultaneously closing the circuit path to the flash lamp in the adjacent branch circuit by actuating the radiation-sensitive switch 22 which is serially connected between said branch circuits to the conductive state. This cooperative action is repeated between successive branch circuits until all four lamps in the group have been fired from simultaneous actuation of adjoining switch and fuse elements with radiation being emitted from an adjacent flash lamp. By further serially connecting all fuse elements 26 between said branch circuits, the likelihood of developing a short circuit condition with an already flashed lamp is understandably reduced. Thus, when a firing pulse is applied to the last branch circuit in the sequence, it becomes necessary to overcome the dielectric breakdown voltages in the previously opened fuse elements for short-circuiting of the already flashed lamps. The likelihood of developing the short circuit condition in the topmost already flashed lamp would be theoretically least in the present circuit configuration by reason of being electrically isolated by all three opened fuse elements.

To demonstrate the approved operational reliability achieved with the present lamp firing circuitry, a comparative test evaluation was conducted between said lamp array and the lamp array disclosed in aforementioned U.S. Pat. No. 4,133,631. For said test evaluation the particular flash lamps employed had an oxygen deficiency to increase the likelihood of short-circuiting from residual unburned combustible metal foil in the lamps. The test evaluation compared the incidence of short-circuiting in groups of four lamps operatively associated as described in the respective circuit board configurations. Of the 74 lamp groups tested with the prior art circuit configuration, 58 lamp groups operated in the proper firing sequence for 75% operating reliability. The operating reliability increased to 95% with the present circuit configuration when only 4 of the 78 lamp groups tested did not fire in the proper sequence.

As previously indicated, a fuse element for operation in the above described lamp firing circuitry can simply comprise a more narrow width of the circuit pattern comprising an organic resin matrix having particulated electrically conducting material and a radiation absorbing material dispersed therein than the width of a circuit pattern elsewhere in the electrical circuit and which is located where said dielectric substrate has a reduced thickness relative to the remaining thickness of the dielectric substrate of the circuit board member. Suitable fuse elements constructed in this manner are thereby modifications of the conductive ink compositions disclosed in the aforementioned U.S. Pat. Nos. 3,968,056 and 3,988,647 wherein a radiation absorbing material has been dispersed in the liquid ink to enhance thermal decomposition when actuated by radiation being emitted from the operatively associated flash lamps. Accordingly, an illustrative circuit ink composition can have in proportions by weight 32.5 parts of an ultraviolet curable polyester resin and 67.0 parts silver-coated glass spheres. When cured to a solid state at ordinary temperatures, the more narrow width fuse element portions of said circuit board pattern effectively interrupts a circuit path when actuated by an adjoining flash lamp to produce physical separation of the incorporated electrically conductive filler particles. The indentations are reduced thickness portions of the circuit board member at fuse locations serve to reduce dissipation of the absorbed thermal and/or light energy when the fuse elements are actuated in this manner as well as enhance localized melting or decomposition of the circuit board member at the fuse locations causing an actual opening in said underlying substrate.

While preferred embodiments of the invention have been shown and described, various other embodiments and modifications thereof will become apparent to persons skilled in the art. It is therefore intended to limit the present invention only by the scope of the following claims.

What I claim as new and desire to secure by Letters Patent of the United States is:

1. In a circuit board for a photoflash array having a lamp firing circuit pattern deposited on a dielectric substrate and radiation sensitive switches connected in said circuitry for sequential firing of a plurality of flash lamps connected thereto, said circuit pattern comprising an organic resin matrix having particulated electrically conductive material dispersed therein and further including radiation sensitive fuse elements located at positions where the dielectric substrate has a reduced thickness relative to the remaining thickness of said dielectric substrate and with said fuse elements being formed by providing a more narrow width of said circuit pattern at the fuse locations than the remaining width of said circuit pattern, the improvement wherein said fuse elements are electrically connected together in a series circuit combination to increase the dielectric breakdown voltage of said combination upon successive actuation of the fuse elements, each of said flashlamps being connected in branch circuits having a radiation sensitive switch connected between one side of each pair of successively connected flashlamps and a radiation sensitive fuse element connected between the remaining side of each pair of successively connected flashlamps.

2. A circuit board as in claim 1 wherein a radiation absorbing material is also dispersed in the circuit pattern.

3. A circuit board as in claim 2 wherein the radiation absorbing material is a dye.

4. A circuit board member as in claim 1 wherein a radiation absorbing coating is deposited on the circuit pattern at the fuse locations.

5. A circuit board as in claim 1 wherein the radiation sensitive switches and the radiation sensitive fuse elements are located adjacent said flash lamps for simultaneous activation of an adjoining switch and fuse element.

6. A circuit board as in claim 1 wherein the particulated electrically conductive material comprises metal coated glass spheres.

7. A circuit board as in claim 6 wherein the particulated electrically conductive material further contains metal flakes.

8. In a circuit board for a photoflash array having a lamp firing circuit pattern deposited on a dielectric substrate and radiation sensitive switches connected in said circuitry for sequential firing of a plurality of flash lamps connected thereto, said circuit pattern comprising a radiation cured organic resin matrix having a particulated electrically conductive material selected from the group consisting of a particulated electrically conductive metal or a particulated electrically conductive metal containing material, including mixtures thereof, and with no more than about 15% by weight of said particulated electrically conductive material having an aspect ratio of diameter to thickness of a value greater than 20 being dispersed in said organic resin matrix, said circuit pattern further including radiation sensitive fuse elements located at positions where the dielectric substrate has a reduced thickness relative to the remaining thickness of said dielectric substrate and with said fuse elements being formed by providing a more narrow width of said circuit pattern at the fuse locations than the remaining width of said circuit pattern, the improvement wherein said fuse elements are electrically connected together in a series circuit combination to increase the dielectric breakdown voltage of said combination upon successive actuation of the fuse elements, each of said flashlamps being connected in branch circuits having a radiation sensitive switch connected between one side of each pair of successively connected flashlamps and a radiation sensitive fuse element connected between the remaining side of each pair of successively connected flashlamps.

9. A circuit board as in claim 8 wherein a radiation absorbing material is also dispersed in the circuit pattern.

10. A circuit board member as in claim 8 wherein a radiation absorbing coating is deposited on the circuit pattern at the fuse locations.

11. A circuit board as in claim 8 in which at least 85% by weight of said particulated electrically conductive material is constituted by metal coated glass spheres.

12. A circuit board as in claim 8 in which at least about 40% and not more than about 90% by weight of said circuit pattern is said particulated electrically conductive material.

13. A circuit board as in claim 8 wherein the radiation sensitive switches and the radiation sensitive fuse elements are located adjacent said flash lamps for simultaneous activation of an adjoining switch and fuse element.

* * * * *